United States Patent

Shor et al.

[11] Patent Number: 5,569,932
[45] Date of Patent: *Oct. 29, 1996

[54] POROUS SILICON CARBIDE (SIC) SEMICONDUCTOR DEVICE

[75] Inventors: Joseph S. Shor, Flushing, N.Y.;
Anthony D. Kurtz, Teaneck, N.J.

[73] Assignee: Kulite Semiconductor Products, Inc., Leonia, N.J.

[*] Notice: The term of this patent shall not extend beyond the expiration date of Pat. No. 5,298,767.

[21] Appl. No.: 376,854

[22] Filed: Jan. 23, 1995

Related U.S. Application Data

[60] Division of Ser. No. 115,983, Sep. 1, 1993, Pat. No. 5,454,915, which is a continuation-in-part of Ser. No. 957,519, Nov. 12, 1992, abandoned.

[51] Int. Cl.⁶ ............... H01L 47/00; H01L 31/0312; H01L 27/15; H01L 33/00
[52] U.S. Cl. ............... 257/3; 257/76; 257/77; 257/80; 257/103
[58] Field of Search ............... 257/3, 76, 77, 257/80, 88, 103

[56] References Cited

U.S. PATENT DOCUMENTS

| | | | |
|---|---|---|---|
| 5,229,625 | 7/1993 | Suzuki et al. | 257/77 |
| 5,285,078 | 2/1994 | Mimura et al. | 257/59 |
| 5,298,767 | 3/1994 | Shor et al. | 257/77 |
| 5,331,180 | 7/1994 | Yamada et al. | 257/77 |
| 5,348,618 | 9/1994 | Canham et al. | 156/644 |

Primary Examiner—Mahshid Saadat
Attorney, Agent, or Firm—Plevy & Associates

[57] ABSTRACT

Porous silicon carbide is fabricated according to techniques which result in a significant portion of nanocrystallites within the material in a sub 10 nanometer regime. There is described techniques for passivating porous silicon carbide which result in the fabrication of optoelectronic devices which exhibit brighter blue luminescence and exhibit improved qualities. Based on certain of the techniques described porous silicon carbide is used as a sacrificial layer for the patterning of silicon carbide. Porous silicon carbide is then removed from the bulk substrate by oxidation and other methods. The techniques described employ a two-step process which is used to pattern bulk silicon carbide where selected areas of the wafer are then made porous and then the porous layer is subsequently removed. The process to form porous silicon carbide exhibits dopant selectivity and a two-step etching procedure is implemented for silicon carbide multilayers.

22 Claims, 3 Drawing Sheets

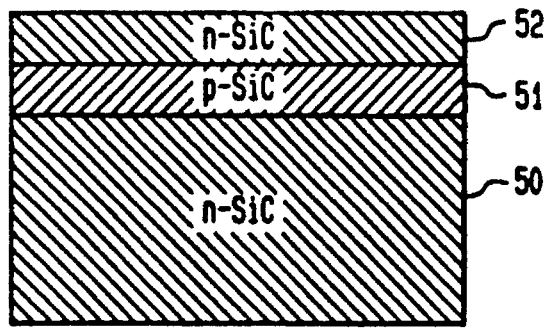
FIG. 4
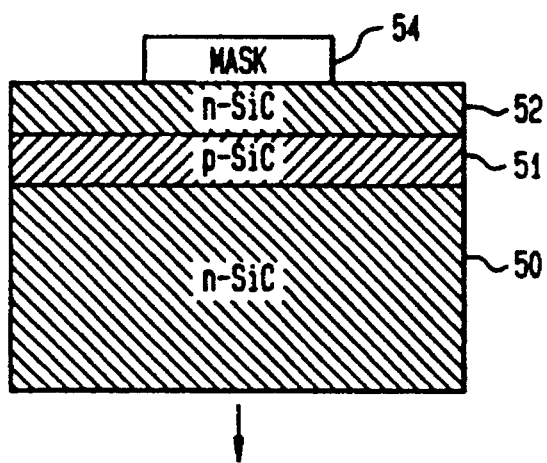
FIG. 5A
FIG. 5B
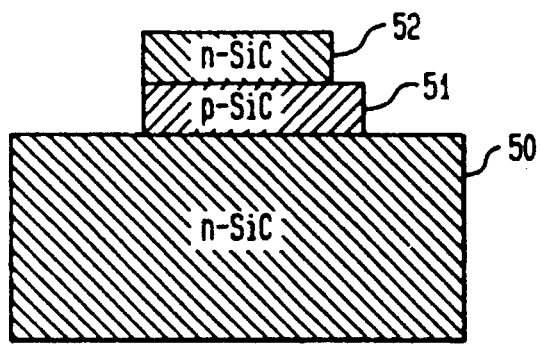
FIG. 6
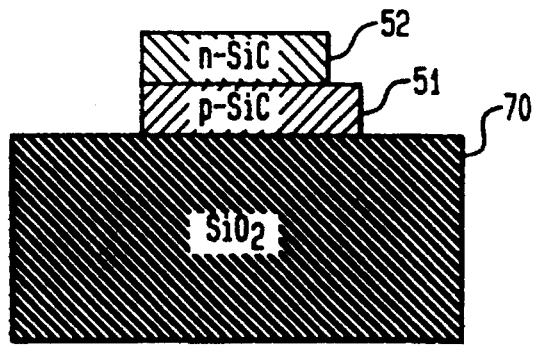
FIG. 7

POROUS SILICON CARBIDE (SIC) SEMICONDUCTOR DEVICE

This invention is the subject matter of a NASA contract, contract No. NAS-3-26599 and the U.S. Government may have rights thereunder.

This is a division, of application Ser. No. 08/115,983, filed Sept. 1, 1993. now U.S. Pat. No. 5,454,915 which is a cip of 07/957,519, filed Nov. 12, 1992, now abandoned.

RELATED APPLICATIONS

The assignee herein, Kulite Semiconductors Products is the record owner of U.S. Patent application entitled "HIGH TEMPERATURE TRANSDUCERS AND METHODS OF FABRICATING THE SAME EMPLOYING SILICON CARBIDE", Ser. No. 07/694,490, filed on May 2, 1991 for Anthony D. Kurtz et at. See also U.S. patent. application Ser. No. 07/777,157 filed on Oct. 16, 1991 entitled "METHOD FOR ETCHING 0F SILICON CARBIDE SEMICONDUCTOR USING SELECTIVE ETCHING 0F DIFFERENT CONDUCTIVITY TYPES" by J. S. Shor et at. and assigned to Kulite.

1. Field of the Invention

This invention relates to semiconductor devices in general and more particularly, to semiconductor devices which employ single crystal silicon carbide (SIC) and methods of making porous silicon carbide.

2. Background of the Invention

In the recent literature there has been much interest in electrochemical processes which cause semiconductors, such as silicon, to become porous. Various articles have appeared in Applied Physics Letters and other publications relating to such devices. See for example, an article by V. Lehman and U. Gosele, Applied Physics Letters, Volume 58, Page 856 (1991). See also an article in Volume 57 of Applied Physics Letters, by L.T. Canham, Page 1046 (1990). The prior art was cognizant of the fact that in certain instances, porous silicon exhibits unique properties which are superior to those of bulk silicon. For example, high efficiency luminescence has been observed in porous silicon above the 1.1 eV band-gap of bulk material, which suggests that optical devices can be fabricated based on the use of porous silicon. Control of the pore size on the nanometer scale can allow porous materials to be used as filters in solid state chemical sensors.

In any event, there are several theories for the formation mechanisms of pores in silicon. A good reference is the article by R. L. Smith and S. D. Collins appearing in the Journal of Applied Physics, Volume 8, R1 (1992). Studies suggest that the depletion regions of pores overlap, causing a carrier depletion in the interpore region, and thus the current is confined to the pore tips. In an article that appeared in the Journal of the Electrochemical Society, Volume 138, Page 3750 (1991) by X. G. Zhang, there was indicated that pore propagation is attributed to a higher electric field at the pore tips which causes dissolution to occur more rapidly through the intermediate step of silicon dioxide formation, while along the pore walls dissolution occurs through the slower process of direct dissolution.

Demonstrations of room temperature visible luminescence from porous silicon have generated much interest in using the material for optoelectronics. Initially, there was of course much conjecture about the mechanisms which provide the visible luminescence. However, a general consensus has been reached among most researchers that at least a portion of the luminescence is associated with quantum structures (wires or dots) in the porous silicon. These quantum structures would allow a relaxation of the momentum selection rules by confining the charges spatially, thus allowing direct band-gap transitions. Additionally, the charge confinement would increase the effective band-gap, thereby pushing it into the visible region. The quantum confinement theory has been supported by considerable theoretical and experimental evidence.

Researchers, such as C. Tsai, K. H. Li and D. S. Kinosky, et al., in an article in Applied Physics Letters, Volume 60, Page 1770 (1992) have shown that surface chemistry, specifically hydrogen termination, play an important role in the luminescence. This suggests that luminescence in porous silicon may have similar mechanisms as a-Si, which exhibits band gap widening into the visible region when hydride species are formed on the surface. A portion of the visible luminescence of porous Si may be associated with the SiH. It has yet to be conclusively determined whether the hydrogen termination serves only to passivate the surface or whether there is a contribution to the luminescence by amorphous Si hydride. Nevertheless, it is very clear that microcrystals of <5 nm dimension will exhibit band-gap widening and above band-gap luminescence.

There has been interest in SiC as a semiconductor material since the 1950's. Its wide band-gap, high thermal conductivity, high breakdown electric field and high melting point make SiC an excellent material for high temperature and high power applications. SiC also exhibits interesting optical properties, such as deep UV absorption, visible transparency and blue photo- and electro-luminescence. However, good quality crystals were unavailable, causing the early research efforts to stagnate. Recent developments in single crystal epilayer and boule growth have generated new interest in SiC. This has resulted in the development of SiC blue LED's, UV photodiodes and high temperature electronic components. However, due to its indirect band-gap, the efficiency of SiC optoelectronic devices is limited. Thus, research is underway to develop other wide band-gap semiconductors, such as $SiC_xAlN_y$ and III–V nitrides for optical applications. However, the crystal growth technology for these materials is still very underdeveloped. Porous SiC could be very useful, since it has superior optical properties than SiC, and may benefit from the relatively mature growth and processing technology that SiC has to offer. Devices which would benefit from these superior optical qualities include LED's, Lasers, and Photodetectors. Furthermore, SiC is very difficult to etch because of its chemical inertness. Therefore, porous SiC could also be used to pattern this material for electronic device fabrication.

There have been several reports on the electrochemical dissolution of SiC. Recently, Shor, et al. used laser assisted electrochemical etching to rapidly etch high relief structures in SiC. See an article by J. S. Shor et al., in Journal of Electrochemical Society, Volume 139, Page 143, May 22, 1992. M. M. Carrabba et al., in an article in Electrochemical Society Extended Abstracts, Volume 89–2, Page 727 (1989), reported etching diffraction gratings in n-type β-and α-SiC at anodic potentials with a uniform light source. The fundamental electrochemical studies indicate that the presence of HF in aqueous solutions is important to etch SiC electrochemically. Glerria and Memming in Volume 65 of the Journal of Electroanl Chem., on Page 163 (1975) reported that α-SiC dissolves in aqueous $H_2SO_4$ solutions at anodic potentials through the formation of a passivating layer, which was suggested to be $SiO_2$, since it dissolved in HF.

The present invention relates to the formation of porous SiC, a new material. It is indicated that porous SiC material itself, as well as a process to fabricate the porous SiC is provided. Porous SiC can be employed for UV and blue light sources such as LED's and diode-lasers. Porous SiC can be utilized as a filter in chemical processes and can be used to provide heterojunction devices using the porous SiC/bulk SiC interface. As will be described, the methods employ a selective etching of bulk SiC by forming a porous layer on the surface, oxidizing it and stripping it in hydrofluoric (HF) acid. One can also provide dielectric isolation of SiC devices on a wafer by oxidizing a buried porous SiC layer.

SUMMARY OF THE INVENTION

This invention relates to porous SiC, its fabrication, and utilization in semiconductor devices. Three applications of porous SiC are disclosed in this light.

1) Porous SiC can be fabricated in a manner which will result in a significant portion of nanocrystallites within the material in the sub 10-nm regime. This will result in bandgap widening and a much more efficient luminescence from the material. As such, porous SiC has superior properties than bulk SiC for semiconductor light sources, such as LEDs and Lasers. The use of porous SiC in these devices enable them to operate at UV wavelengths. When passivated, porous SiC exhibits a much brighter blue luminescence (by a factor of 50) than bulk material, enabling more efficient blue light sources. The enhanced properties of porous SiC are also useful for photodetectors.

2) Porous SiC also is useful as a sacrificial layer for the patterning of SiC. SiC is a very inert material, and as such, is difficult to etch by conventional methods. Porous SiC, however, can be removed from its bulk substrate by oxidation and other methods. Therefore, a two step process can be used to pattern bulk SiC, whereby selected areas of the wafer are made porous, and then the porous layer is subsequently removed. The process to form porous SiC exhibits dopant selectivity (i.e. one conductivity type becomes porous while another is unaffected). Thus, using the two step etching procedure, dopant selective etch-stops may be implemented for SiC multilayers.

3) Porous SiC can be oxidized at a much faster rate (several orders of magnitude) than bulk SiC. This property can be utilized to fabricate dielectrically isolated SiC layers and/or selectively introduced thick sections of $SiO_2$ into a SiC wafer. SiC-oninsulator is fabricated by oxidizing a buried porous layer which is underneath a non-porous SiC layer. The porous layer is oxidized completely, and the remaining structure is dielectrically isolated SiC. This aspect of porous SiC is very useful in the fabrication of high temperatures/power/frequency electronic components.

BRIEF DESCRIPTION OF THE FIGURES

FIGS. 4–7 depict various steps in employing SiC to form a dielectrically isolated SiC device (e.g..the diode) according to this invention.

DETAILED DESCRIPTION OF THE INVENTION

This description is divide into four parts for clarity: 1) the fabrication method of porous SiC, 2) the use of porous SiC for optoelectronic devices, 3) the use of porous SiC for patterning or shaping SiC and 4) the use of porous SiC to achieve dielectrically isolated SiC layers and devices.

Fabrication of Porous SiC

Figure 1:
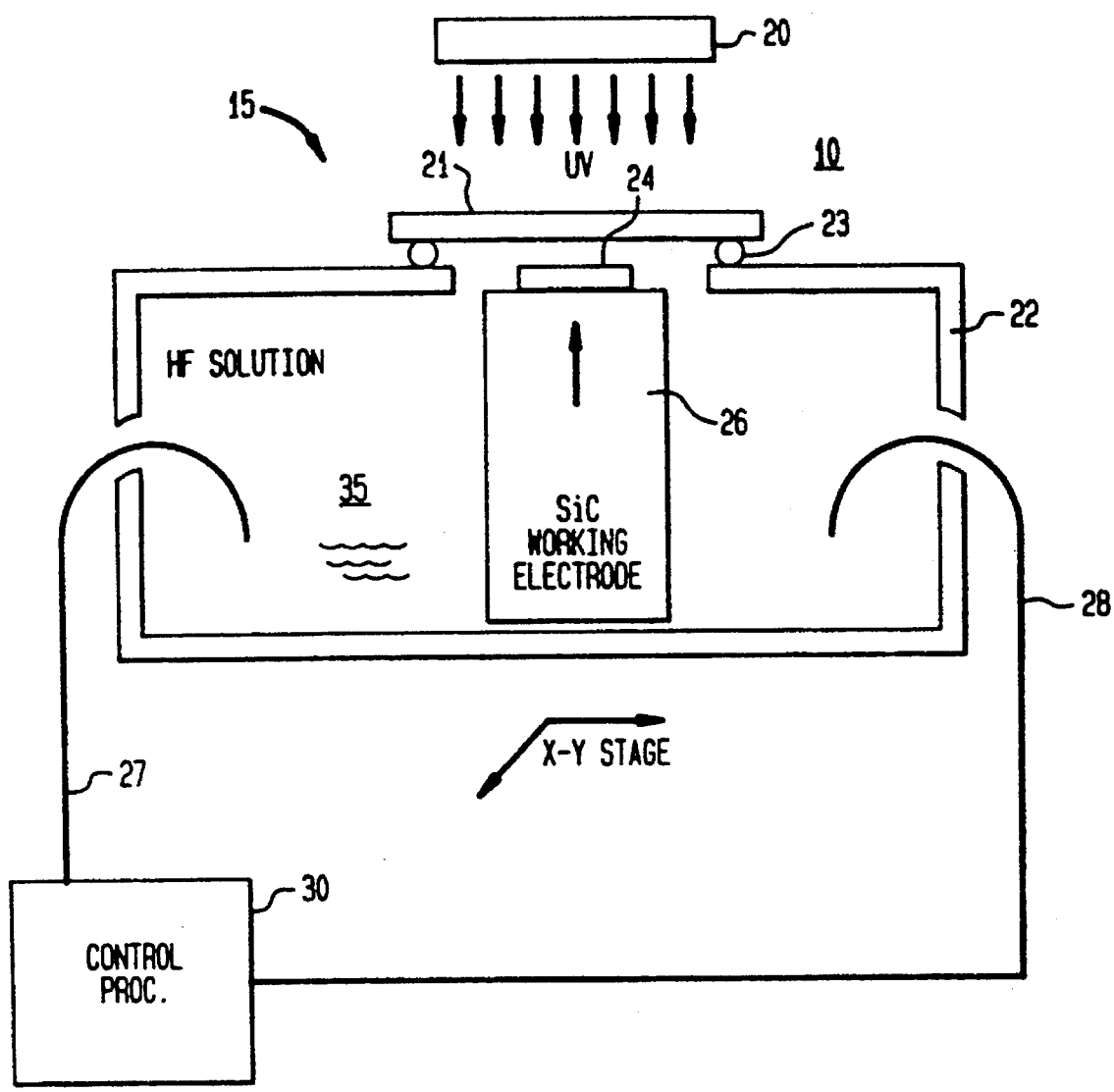
FIG. 1 is a diagram depicting a process for forming porous SiC utilizing an electrochemical cell.

Referring to FIG. 1, there is shown apparatus which can be used to form porous SiC. The formation of porous SiC occurs under electrochemical anodization. There are wide variety of fabrication conditions that result in pore formation, and the microstructure, pore size, pore spacing and morphology of the material is dependent on the process parameters. Referring to FIG. 1, there is shown an electrochemical cell 22. The cell 22 may be fabricated from an electrolyte-resistant, dielectric material, such as Teflon plastic material (trademark of dupont Company). The cell 22 has a lead 27 which is a platinum wire counter-electrode and a lead 28 which is a saturated calomel reference electrode. Both leads are directed to a control processor apparatus 30 to control the entire process as will be explained. The cell 22 contains a electrolyte 35. The electrolyte 35 used in cell 22 may be a hydrofluoric acid (HF) solution which is relatively dilute, as for example a 2.5% HF or any other acidic solution containing $F^-$ or $Br^-$ ions otherwise capable of dissolving $SiO_2$. A semiconductor wafer such as n-type 6H-SiC samples are contacted electrically with nickel ohmic contacts and are placed in a carrier 24 which carrier is as indicated placed within the electrochemical cell 22. The semiconductor sample is encapsulated in black wax so that only the bare semiconductor surfaces are exposed as the ohmic contacts and the leads are protected. Thus as seen in FIG. 1, the semiconductor wafers are positioned and mounted in the carrier module 24 which is positioned on the top surface of a pedestal 26 which is located in the cell 22. The semiconductor acts as the working electrode in this arrangement. Care must be taken, that all surfaces not to be etched, which may corrode in the electrolyte, must be covered with the black wax or other encapsulant. The semiconductor SiC is preferably biased with respect to the saturated calomel reference electrode 28 at a suitable potential for the n-type layer to photo corrode. The bias voltage is provided to the control processor 30. In this embodiment an anodic potential is applied to the semiconductor. In the case of n-type SiC, ultraviolet or UV light from source 20 illuminates the sample surface in order for dissolution to occur. The light is directed through a sapphire window 21 where it impinges upon the surface of the semiconductor supported by the carrier 24. In p-SiC, dissolution can occur in the dark. The depth of the porous layer and its structure (e.g. pore size and interpore spacing) is determined by the anodization time, the UV light intensity, the applied potential, the pH and the doping levels of the crystals. As such the porosity, interpore spacings, and morphology can be controlled by varying these parameters properly. As indicated, the semiconductor is subject to electrochemical etching in the electrolyte 35, preferably while being exposed to UV light. UV light is provided from the UV light source 20 through the light transmissive cover 21 sealed to the top of the cell 22 by means of seals 23. The UV exposure generates holes in the semiconductor in the area which is exposed by the ultraviolet light. In any event, for a more detailed description of anodic dissolution of SiC, see the above-noted application which was filed on Oct. 16, 1991 entitled METHODS FOR ETCHING OF SILICON CARBIDE SEMICONDUCTOR USING SELECTIVE ETCHING OF DIFFERENT CONDUCTIVITY TYPES, Ser. No. 07/777, 157. Again referring to FIG. 1, it is indicated that pore formation will occur under the following process conditions. For n-type 6H-SiC the anode potential is equal to 0–2 $V_{sce}$ (sce=saturated calomel electrode) which is applied by the control processor 30. The UV intensity from light source 20 is maintained between 50–500 mW/cm$^2$. The UV wavelength is selected in the range of 250–400 nanometers. The carrier concentration of the silicon carbide wafer is $3 \times 10^{18}$/cm$^3$. The concentration of the HF solution 35 is equal to 2.5 % in water. In order to obtain porous p-type silicon for p-type 6H-SiC, the anodic potential is equal to 1.8 to 2.8 $V_{sce}$ the carrier concentration is equal to 2–3×10$^{18}$/cm$^3$ and the HF concentration is equal to 2.5 % in water. The conditions for porous film formation are not limited to those delineated above, but pore formation has been directly observed under the above conditions. Under some of these conditions, pores spacings which are below 10 nm will result.

It should be noted that the potential of pore formation in n-SiC is lower than that of p-SiC. Therefore, a porous layer can be formed on a pn junction, such that the nSiC side of the junction becomes porous and the p-SiC is unaffected. This can also be accomplished in reverse by anodizing the p-SiC between 1.8–2.8$V_{sce}$ in the absence of UV, such that the p-SiC becomes porous and the n-SiC is unaffected.

Figure 2:
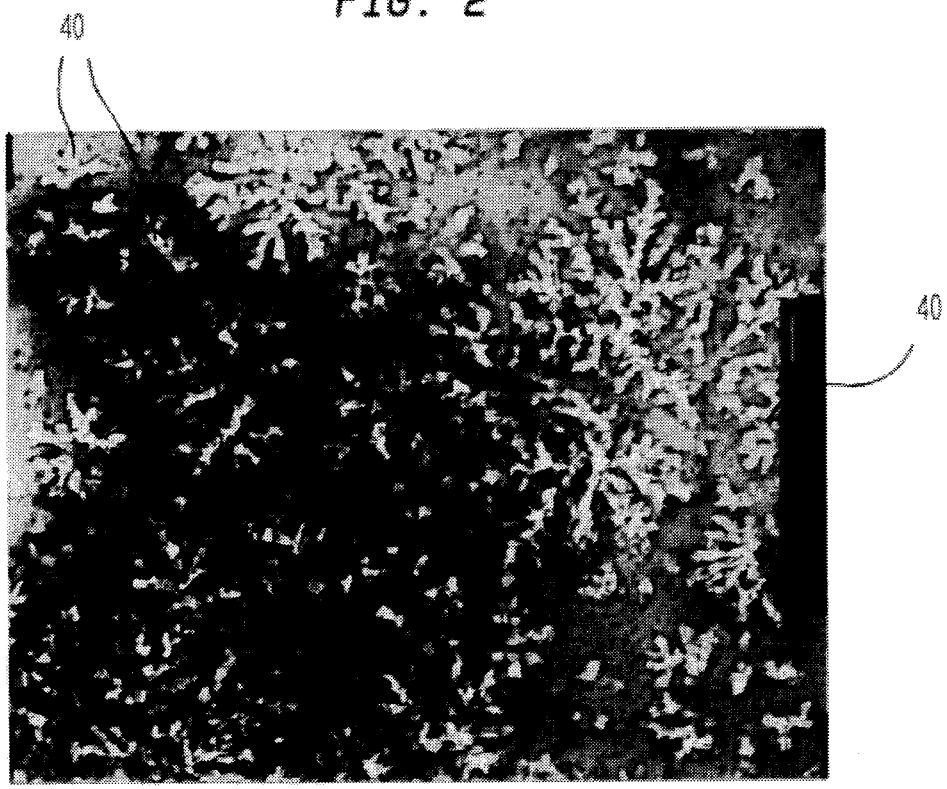
FIG. 2 is a top plan view transmission electron micrograph of a porous SiC layer formed try the process described in FIG. 1.

Referring to FIG. 2, there is shown a top plan view transmission electron micrograph of a porous SiC layer formed in a n-type 6H-SiC at $V = 1.4V_{sce}$, I=300 mW/cm$^2$of UV (250–400 nm), and $N_d$=3 ×10$^{18}$cm$^{-3}$ in 2.5% HF. The bright areas 40 are voids or pores in the SiC. The pores may range in size between 10 and 100 nm. The spacing between these pores range between about 5nm to 100nm. This indicates that both quantum crystalline structures (less than 10 nm) and enlarged crystalline structures can be fabricated. The pore size, shapes and spacings are very much a function of the processing conditions. Electron diffraction of the porous areas prove that the material is single crystal 6H-SiC. Thus, as one can ascertain from the micrograph of FIG. 2, one can produce porous SiC as disclosed therein and according to the above-noted process. In any event, porous SiC has the potential to be utilized as a UV generation medium in light emitting diodes (LED's) and laser diodes. Such devices would be extremely useful in optical storage, optoelectronic communication systems, laser bumping systems, sensor/detectors and materials processing. These devices may emit light in the UV wavelength.

Optoelectronics from Porous SiC

Semiconductor optoelectronics has, by and large, been limited to III–V compounds due to their direct band-gap. For SiC, a porous structure could increase its already wide band-gap (3 eV for 6H-SiC) and allow direct gap transitions, facilitating which efficient UV/near UV luminescence. These luminescent properties are useful in LED or a Laser, thus greatly enhancing current optoelectronic capabilities by including deeper wavelengths in semiconductor light sources. These direct bandgap transitions also enable more efficient blue LEDs to be fabricated when porous .SiC is used rather than bulk SiC.

SiC has unique optical properties, such as blue electroluminescence, which have facilitated the development of blue LED's. However, due to the indirect band-gap of SiC (3 eV for 6H-SiC), the LED's are inefficient. By electrochemically fabricating a microcrystalline porous structure in SiC, it is possible to increase both the band-gap and quantum efficiency, resulting in UV, or deep Blue luminescence. This luminescence will enable the development of semiconductor UV and blue light sources and UV/blue optoelectronic devices from porous SiC.

As noted earlier, porous microcrystalline SiC structures can be electrochemically fabricated with pore spacings of "quantum" dimensions (less than 10nm) in accordance with the present invention. Such structures exhibit luminescence above the band gap. Moreover, the luminescence in the blue range of the spectrum (approximately 2.8 eV) is greatly enhanced by passivating such structures with a passivating agent such as oxygen or hydrogen. Passivation enables the microcrystalline structures to satisfy the conditions for quantum confinement by preventing surface recombination at dangling bond. Passivating agents that may be employed for this purpose include atomic hydrogen, deposited by a plasma or by a HF dip, oxygen, formed by thermal oxidation or anodically, or any other passivating agent which will pin the dangling bond sites. The enhanced luminescence can be utilized in the fabrication of a variety of optoelectronic devices such as blue semiconductor light sources (e.g., light emitting diodes) and semiconductor lasers. It should also be noted that there are a wide variety of conditions which will result in this superior form of porous silicon carbide. Essentially, any thin insulating layer deposited or grown on the porous surface, could provide the desired passivation layer. Thus, the resulting thin passivation layer may be comprised of SiN, SiH, SiO$_n$, or the like.

Laser diodes and LED's have been used extensively in a wide diversity of applications ranging from displays to optical communication systems. Porous SiC UV sources will extend the wavelength capability of this device below the blue wavelengths currently available from single crystal SiC and ZnSe. Such light sources could be useful in a variety of applications. For example, UV sources would enable a smaller spatial volume in optical recording, thus enhancing both spatial resolution and information packing densities in optical storage. UV LED's and lasers are also useful for optical communications and as higher energy pump sources for LASER's and possibly phosphors.

Currently, efforts are underway to develop direct band gap materials with large band gaps, such as GaN, AlN and ZnSe, which have band gaps between 3.2–6.4eV for UV and near UV optoelectronics. A microcrystalline SiC structure would be useful in applications (e.g. blue and UV optoelectronics) for which the other wide gap materials are being investigated. SiC has much more sophisticated device technology associated with it than these other materials and thus offers considerable advantages over these other materials.

Porous SiC is also useful for photodetectors. Porous SiC has a very low reflectivity compared to bulk SIC, which allow more of the incident radiation to be collected. The wider bandgap of the porous SiC enables the easy fabrication of heterojunction photodetectors, which are know to exhibit superior properties than homojunction detectors.

Patterning of SiC Using Porous SiC

SiC is a very difficult material to pattern into device structures because of its chemical inertness. By selectively fabricating a porous layer into a silicon wafer, oxidizing the layer and removing the oxide in HF, deep etched features can be patterned.

Figure 3:
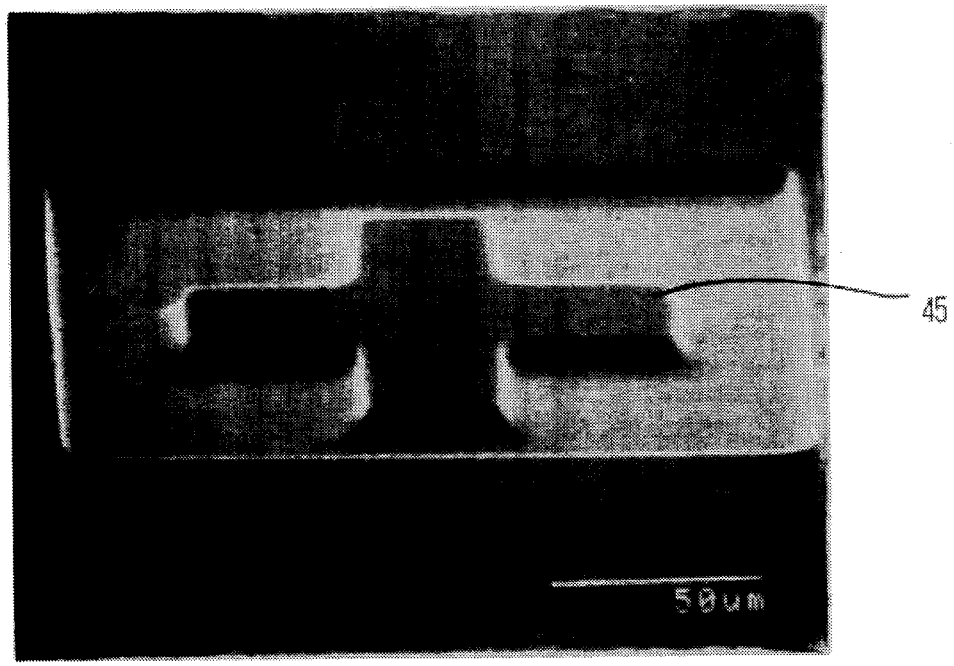
FIG. 3 is a top plan view electron micrograph of a pattern etched into a layer of SiC.

Referring to FIG. 3, there is shown a SEM micrograph of a pattern etched into n-type 6H-SiC, by the intermediate step of forming a porous layer. A metal mask was deposited on the SiC provided as described above, and patterned using standard photolithographic processes. The etching conditions to form porous SiC were I=500 mW/cm² of UV (250–400 nm), V=1.5 $V_{sce}$, 2.5 % HF for 30 minutes. The mask was subsequently removed and the SiC was thermally oxidized in a steam ambient for 4 hrs. at 1150° C. to fully oxidize the porous layer, and form a thin oxide (<1000 Å) on the parts of the surface previously covered by the metal. The oxide was etched for 2 min in buffer HF, resulting in the pattern 45 formed on the SiC. These conditions are an example of how SiC can be etched by the two step process of 1) forming a porous layer on the surface and 2) removing the porous layer. Furthermore, by employing the selective anodization conditions discussed earlier, a layer of one conductivity type can be etched, while a second layer of a different conductivity type acts as an etch-stop.

Dielectric Isolation Using Porous SiC

The following steps exhibit how porous SiC can be used to dielectrically isolate SiC devices. In this case the device described is a pn-junction diode, but the principles are equally applicable to other devices as well. Referring to FIG. 4, one proceeds with an n-SiC wafer 50, two epilayers, one p-type 51 and one n-type 52 are grown by chemical vapor deposition. In FIG. 5a, a mask 54 in placed on the top n-type epilayer 52 and defined using photolithography. In FIG. 5b, the n-SiC layer 52 is etched by the previously mentioned methods. In FIG. 6, the p-SiC layer 51 is patterned in a similar manner. In FIG. 7, the bottom n-SiC 52 becomes porous and p-SiC 51 remains inert. The top n-SiC epilayer does not come into contact with the solution. The porous layer is then oxidized, resulting in a dielectrically isolated pn-junction. The pn-junction is comprised of single crystal SiC layers (which are not porous).

As one can ascertain, the techniques described above can be implemented by many different procedures as briefly alluded to. Reference is again made to U.S. patent application Ser. No. 07/694,490 entitled HIGH TEMPERATURE TRANSDUCER METHODS OF FABRICATING THE SAME EMPLOYING SILICON CARBIDE, filed on May 2, 1992 and assigned to assignee herein. In that application, a pertinent reference was cited and entitled GROWTH AND CHARACTERIZATION OF CUBIC SiC SINGLE CRYSTAL FILMS ON SILICON by J. Anthony Powell et al., published in the Journal of Electrochemical Society, Solid States Science and Technology, June 1987, Volume 134, No. 6, Pages 1558–1565. This article contains an extensive bibliography and approaches using SiC in various applications and in the processing of SiC. As is well known, one can grow silicon carbide of either n or p-type by means of chemical vapor deposition techniques (CVD). Such techniques are well known for growing silicon carbide on silicon wafers, see for example the above-noted article. The doped gas employs tri-methyl aluminum. In a similar manner, the growth of silicon carbide layers on n-type silicon carbide is also known and can be accomplished by conventional CVD techniques. There are various articles in the prior art which teach the growth of films of silicon carbides. See for example an article by J. A. Powell, L. G. Matus and M. A. Kuczmarski in the Journal of the Electrochemical Society, Volume 134, Page 1558 (1987). See also an article by L. G. Matus, J. A. Powell, C. S. Salupo, Applied Physics Letters, Volume 59, Page 1770 (1991). Such articles, as well as the above-noted applications, teach the growth of layers of silicon carbide utilizing either p or n-type silicon carbide on silicon wafers or wafers of silicon carbide. In any event, such techniques employ standard masking techniques as for example, standard photolithographic processes which are also well known in the art.

Thus there is described at least one useful device utilizing porous SiC, but many other devices are in fact contemplated. There is described the use of porous SiC to pattern SiC. There is described a method of forming SiC-on-insulator structures using porous SiC. There is described a method and technique for the formation of porous SiC, a material that can have wide spread utility. The material as well as the process, will enable the formation of various devices with great potential use.

What is claimed:

1. A semiconductor device employing at least one layer of a semiconducting porous silicon carbide (SiC), said layer being of a first conductivity type.

2. The semiconductor device according to claim 1, wherein said layer is monocrystalline SiC.

3. The semiconductor device according to claim 1, wherein pores of said layer are less than 1 micron in diameter.

4. The semiconductor device according to claim 1, wherein pores of said layer are between 10 and 100 nm in diameter.

5. The semiconductor device according to claim 1, further including a thin passivation layer on the surface of said porous layer.

6. The semiconductor device according to claim 5, wherein said passivation layer is $SiO_2$.

7. The semiconductor device according to claim 5, wherein said porous layer has a pore spacing of less than 10 nm.

8. The semiconductor device according to claim 1, wherein said device is an optoelectronic device capable of UV luminescence.

9. The semiconductor device according to claim 8, where said optoelectronic device is a light source.

10. The semiconductor device according to claim 9 where said light source emits light in the ultraviolet portion of the spectrum.

11. The semiconductor device according to claim 9 where said light source emits light in the visible portion of the spectrum.

12. The semiconductor device according to claim 9 where said light source emits light in the blue portion of the spectrum.

13. The semiconductor device according to claim 8 wherein said optoelectronic device is a photodetector.

14. An SiC-on-insulator structure comprising:
   at least one layer of SiC of a given conductivity type,
   an insulating layer of $SiO_2$, said layer of SiC being positioned on said insulating layer and said insulating layer being formed by oxidizing a substrate or layer of porous silicon.

15. The structure of claim 14, wherein said insulating layer of $SiO_2$ is densifted by a thermal annealing process.

16. A semiconductor material comprising at least one layer of porous SiC formed by anodizing a given conductivity type SiC layer electrochemically.

17. The semiconductor material according to claim 16 where said porous layer is monocrystalline.

18. The semiconductor material according to claim 17 wherein said porous layer is UV luminescent.

19. The semiconductor material according to claim 16, wherein said porous layer is passivated with an insulating layer.

20. The semiconductor material according to claim 19 wherein said insulating layer is $SiO_2$.

21. The semiconductor material according to claim 19 wherein said pores and pore spacings are submicron.

22. The semiconductor material according to claim 16, wherein spacings between pores of said layer are less than 10 nm.

* * * * *